United States Patent [19]
Onishi et al.

[11] Patent Number: 5,854,104
[45] Date of Patent: Dec. 29, 1998

[54] PROCESS FOR FABRICATING NONVOLATILE SEMICONDUCTOR MEMORY DEVICE HAVING A FERROELECTRIC CAPACITOR

[75] Inventors: Shigeo Onishi, Nara; Takao Kinoshita, Osaka; Jun Kudo, Nara, all of Japan

[73] Assignee: Sharp Kabushiki Kaisha, Osaka, Japan

[21] Appl. No.: 791,406

[22] Filed: Jan. 30, 1997

[30] Foreign Application Priority Data

Apr. 25, 1996 [JP] Japan .................................. 8-105421

[51] Int. Cl.⁶ .................. H01L 21/00; H01L 21/8242; H01L 21/20
[52] U.S. Cl. ................... 438/240; 438/3; 438/253; 438/396
[58] Field of Search ................. 438/3, 240, 253, 438/396; 257/310

[56] References Cited

U.S. PATENT DOCUMENTS 5,046,043  9/1991  Miller et al. .................. 257/310
5,350,705  9/1994  Brassington et al. ............. 438/3
5,407,855  4/1995  Maniar et al. .................. 438/3
5,418,388  5/1995  Okudaira et al. ................ 257/310

OTHER PUBLICATIONS

Onishi et al., IEDM(1994), "A Half–Micron Ferroelectric Memory Cell Technology with Stacked Capacitor Structure", pp. 843–846.

Primary Examiner—Charles L. Bowers, Jr.
Assistant Examiner—Toniae M. Thomas
Attorney, Agent, or Firm—Nixon & Vanderhye, P.C.

[57] ABSTRACT

A process for fabricating a nonvolatile semiconductor memory device has one transistor and one ferroelectric capacitor electrically connected to each other by a contact plug, which comprising forming a transistor; forming an inter-layer insulating film, at least an upper surface portion thereof being a titanium oxide film; forming a capacitor lower electrode; and forming a capacitor insulating film and a capacitor upper electrode, wherein the lower electrode forming step comprises: depositing a titanium nitride film and a platinum film on the titanium oxide film; etching the platinum film with a first etching gas adapted to suppress deposition of substances including platinum; and etching the titanium nitride film with a second etching gas having a high etching selectivity to the titanium oxide film.

12 Claims, 5 Drawing Sheets

PROCESS FOR FABRICATING NONVOLATILE SEMICONDUCTOR MEMORY DEVICE HAVING A FERROELECTRIC CAPACITOR

BACKGROUND OF THE INVENTION

1. Field of the Invention

The present invention relates to a process for fabricating a nonvolatile semiconductor memory device and, more particularly, to a process for fabricating a nonvolatile random access semiconductor memory device utilizing a ferroelectric film as a capacitor insulating film and adapted for highly dense integration.

2. Related Art

There has been proposed a stacked capacitor memory cell having a 1-transistor/1-capacitor construction and adapted for highly dense integration for fabrication of a ferroelectric nonvolatile memory device (IEDM94, pp.843–846). As is shown by FIG. 2 of a sectional view of this nonvolatile semiconductor memory device, it includes a polysilicon plug 26 formed on a source/drain diffusion layer 24 of a selective transistor, and a capacitor formed atop the polysilicon plug 26 and having a platinum (Pt) film (an upper electrode) 32, a PZT (lead titanate zirconate, $PbZr_xTi_{x-1}O_3$) film 29, a Pt film 28 and a titanium nitride (TiN) film 27 (the Pt film 28 and the TiN film 27 constituting a lower electrode).

An inter-layer insulating film ($SiO_2$ film 31/$TiO_2$ film 30) is formed after the formation of the PZT film 29 and the lower electrode. Then, a contact hole is formed in the inter-layer film 30, 31 on the PZT film 29, followed by the formation of the upper electrode 32. In this case, the effective area of the capacitor equals the area of contact of the PZT film with the upper electrode, and a margin is required so that the lower electrode overlaps the contact hole and the upper electrode. This results in an increased capacitor size. In FIG. 2, reference numerals 21, 22, 23 and 25 denote a silicon substrate, a gate insulating film, a gate electrode and a BPSG film, respectively.

For reduction of the size of the capacitor, it is required to first form the lower electrode (Pt film/TiN film) and then process the upper electrode (Pt film) and the ferroelectric film (PZT film) simultaneously. Where the Pt film is adapted to serve not only as the upper electrode but also as a drive line, the delay in driving the drive line is critical because the width of the drive line having a high specific resistance (typically up to 10 $\mu \Omega$ cm) is reduced for highly dense integration and size reduction of devices. Therefore, it is essential to apply a film of a lower resistance material such as Al on the drive line (Pt film).

Referring to FIG. 3, a process for fabricating a second prior-art 1-transistor/1-capacitor semiconductor memory device will next be described, in which an upper electrode and a ferroelectric film are simultaneously processed.

A MOS transistor is first formed which has a gate electrode 43 formed on a silicon substrate 41 with intervention of an insulating film 42, and source/drain diffusion regions 44 formed in self-alignment with the gate electrode 43. Then, an inter-layer insulating film 45a and a diffusion prevention film ($TiO_2$ film) 45b are formed over the resulting substrate (FIG. 3(a)).

The inter-layer insulating film 45a and the diffusion prevention film 45b are etched with the use of a mask (not shown) for formation of a contact hole on the source diffusion region 44 of the MOS transistor. Thereafter, polysilicon is deposited over the entire surface of the substrate including the contact hole, and etched back by a CMP (chemical mechanical polishing) method for formation of a contact plug 46.

In turn, lower electrode materials (Pt/TiN) are deposited over the resulting substrate by sputtering, and etched with a chlorine-based gas or a fluorine-based gas for formation of a lower electrode (Pt film/TiN film) 47 (FIG. 3(c)).

Subsequently, PZT and an upper electrode material (Pt) are deposited over the resulting substrate, then covered with a mask (not shown), and simultaneously patterned by using a chlorine-based gas or a fluorine-based gas. Thus, an upper electrode 49 as a drive line and a PZT film 48 as a capacitor insulating film are formed. At this time, the upper electrode 49 and the PZT film 48 are formed as overlapping the lower electrode 47 with a sufficient margin for etching (FIG. 3(d)).

In turn, a silicon oxide film 50 is formed by a CVD method, and then a bit line 51 is formed (FIG. 3 (e)). The construction of a circuit to be formed by employing memory cells fabricated in the aforesaid manner is shown in FIG. 4. Since upper electrodes 49 of the respective memory cells serve as a common drive line, disturbance to adjacent cells during a reading or writing operation can be prevented, and there is no need to form a separate drive line for connection of the upper electrodes. In FIG. 4, reference characters DL, BL, WL and 52 denote a drive line, a bit line, a word line and a drive line driving circuit, respectively.

Since the formation of the lower electrode 47, the upper electrode 49 and the PZT film 48 of the memory cell shown in FIG. 3(e) is achieved by etching with the chlorine-based gas or the fluorine-based gas, the etching may cause the diffusion prevention film 45b (which serves to prevent the direct contact of the ferroelectric PZT film 48 and the inter-layer insulating film 45a) to be removed. It is, therefore, impossible to prevent the deterioration and separation of the ferroelectric film.

Since the upper electrode is formed of Pt, it is difficult to reduce the interconnection resistance, resulting in signal transmission delay at the driving of the drive line. In the memory cell of the construction shown in FIG. 2, the ferroelectric film is flat or free from a step, because the ferroelectric film 29 is first formed on the Pt film as the lower electrode 28 and then the ferroelectric film and the lower electrode 28 are simultaneously processed. In the memory cell of the construction of FIG. 3(e), on the other hand, the upper electrode 49 and the ferroelectric film 48 entirely cover the lower electrode 47. This means that the ferroelectric material has to be deposited over the lower electrode (Pt film/TiN film) 47 having a step and, therefore, it is difficult to form the ferroelectric film 48 uniformly.

Further, since the polysilicon contact plug 46 readily reacts with the Pt film as the lower electrode 47, the TiN film should have a thickness of at least about 2,000 Å for prevention of Pt diffusion into the polysilicon contact plug. This makes it difficult to reduce the step of the lower electrode, thereby deteriorating the coverage of the lower electrode with the PZT film.

The formation of the diffusion prevention film such as of $TiO_2$ is required for prevention of a reaction of the ferroelectric film such as of PZT with the underlying inter-layer insulating film such as of $SiO_2$. The $TiO_2$ film should be uniformly formed, while maintaining the flatness of the plug. In addition, for prevention of the removal of the $TiO_2$ diffusion prevention film during the processing of the lower electrode, it is essential to improve the etching selectivity between the TiN film and the $TiO_2$ film.

For reduction of the resistance of the drive line, a film of a low resistance material such as Al should be applied on the drive line. It is, however, difficult to process an Al/TiN/Pt/PZT multi-layer film with a high accuracy.

SUMMARY OF THE INVENTION

Figure 1A:
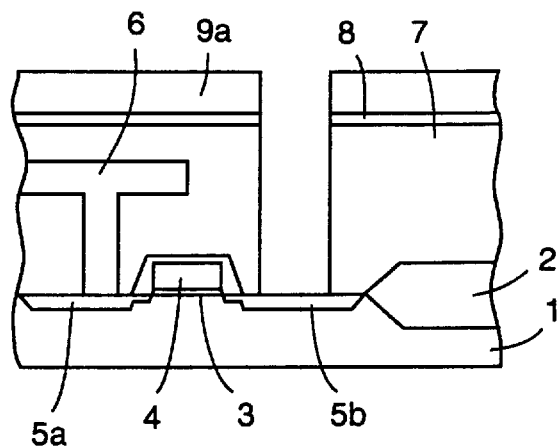
FIGS. 1(a) to 1(f) are sectional views for explaining a fabrication process of a nonvolatile semiconductor memory device in accordance with one embodiment of the present invention.
Figure 1B:
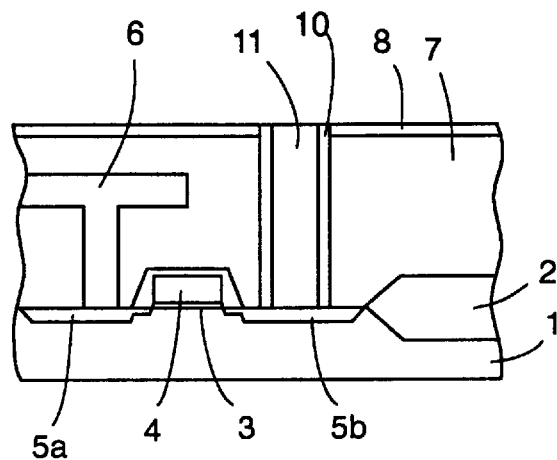

The present invention provides a process for fabricating a nonvolatile semiconductor memory device having one transistor and one ferroelectric capacitor electrically connected to each other by a contact plug, which comprising: forming a transistor; forming an inter-layer insulating film, at least an upper surface portion thereof being a titanium oxide film; forming a capacitor lower electrode; and forming a capacitor insulating film and a capacitor upper electrode, wherein the lower electrode forming step comprises: depositing a titanium nitride film and a platinum film on the titanium oxide film; etching the platinum film with an etching gas adapted to suppress deposition of substances including platinum; and etching the titanium nitride film with an etching gas having a high etching selectivity to the titanium oxide film.

DETAILED DESCRIPTION OF THE PREFERRED EMBODIMENT

In accordance with the present invention, the above process for fabricating a nonvolatile semiconductor memory device is performed in accordance with the following steps. It can reduce the cell size of the memory device for highly dense integration.

Firstly, the formation of the transistor may be achieved by forming a pair of diffusion layers in a semiconductor substrate and forming a gate insulating film and a gate electrode on the semiconductor substrate by known methods. Prior to the formation of the capacitor, the inter-layer insulating film is formed on the transistor. The inter-layer insulating film may be a single-layer or laminate film such as of $SiO_2$, SiN, NSG and BPSG formed with a $TiO_2$ film on the surface thereof, or a single-layer film made of $TiO_2$. The thickness of the inter-layer insulating film is not particularly limited as long as planarization, and insulation from devices underlying and overlying the inter-layer insulating film can be ensured, but is preferably about 500 Å to about 2000 Å. The formation of the inter-layer insulating film may be achieved by a known method such as a CVD or sputter method.

Then, a contact hole is opened in the inter-layer insulating film as extending to the semiconductor substrate, and then a contact plug is formed in the contact hole. The formation of the contact hole may be achieved by a known method such as a photolithographic process, a dry etching method employing $CF_4/CHF_3$ or a wet etching method. The formation of the contact plug may be achieved by first forming a conductive film on the surface of the inter-layer insulating film including the contact hole, and then etching back the conductive film to such an extent that the surface of the inter-layer insulating film is exposed, for example, by a CMP (chemical mechanical polishing) method. Examples of specific conductive materials for the contact plug include tungsten, TiN and $n^+$-polysilicon. A single-layer or multiple-layer such as of titanium, titanium nitride, Ta/TaN, Ta/Ta•SiN, and Ti/TiSiN may intervene as a barrier metal between the contact plug, and the inter-layer insulating film or the semiconductor substrate. The contact plug is preferably comprised of a titanium nitride/Ti barrier metal layer and a tungsten core embedded therein. In this case, the contact plug may be formed by depositing the titanium, titanium nitride and tungsten films over the interlayer insulating film including the contact hole and etching back these three films by CMP method to such an extent that the inter-layer insulating film is exposed.

Further, a titanium nitride film and a Pt film are sequentially deposited over the inter-layer insulating film including the contact plug. The formation of these films may be achieved by a known method such as a PVD, CVD or sputtering method. The total thickness of these films is not particularly limited, but is preferably about 500 Å to about 2000 Å.

Next, the titanium nitride film and the Pt film are patterned into a predetermined configuration for formation of the capacitor lower electrode. The patterning may be achieved by dry etching. The etching of the Pt film may be conducted by using an etching gas adapted to suppress the deposition of substances including Pt. Specifically, the Pt film may be etched with an etching gas containing a chlorine-based bas and a fluorine-based gas with a bias power of about 100 W to about 200 W at a pressure of about 1 mTorr to about 5 mTorr by means of a high density plasma system such as a bias ECR. Examples of specific chlorine-based gases include chlorine gas, $BCl_3$ and $SiCl_4$, which may be used either alone or as a gas mixture. Examples of specific fluorine-based gases include $C_nF_{2n+2}$ (n: a natural number) gas such as $CF_4$ and $C_2F_6$, $CHF_3$ gas and $SiF_4$ gas, which may be used either alone or as a gas mixture. The gases used in the invention can be diluted with an inactive gas for use. Among those, a combination of $Cl_2/C_2F_6$ is particularly preferred. The chlorine-based gas and the fluorine-based gas are preferably supplied to the system at flow rates of about 80 sccm/20 sccm to about 50 sccm/50 sccm, i.e., in a ration of about 4/1 to about 1/1 by volume.

The etching of the titanium nitride film may be performed under such condition that the etching selectivity of the titanium nitride film to the underlying titanium oxide is increased. Specifically, the etching may employ the same bias power and pressure as employed for the etching of the Pt film and an etching gas containing a chlorine-based gas and oxygen gas. Examples of the chlorine-based gas include those described above. Preferably used as the etching gas is $Cl_2/O_2$. The chlorine-based gas and oxygen gas may be supplied at a flow rate of about 50 sccm/1 sccm to about 50 sccm/10 sccm, i.e., in a ratio about 50/1 to about 5/1 by volume. The chlorine-based gas may be used alone as the etching gas for the etching of the titanium nitride film depending on the etching conditions. In consideration of the etching selectivity of the titanium nitride film to the underlying $TiO_2$ inter-layer insulating film, however, the etching gas preferably contains oxygen gas.

Then, the capacitor insulating film and the capacitor upper electrode are formed. First, (i) a ferroelectric film having a thickness of about 1,000 Å to about 3,000 Å is formed over the entire surface of the inter-layer insulating film including the capacitor lower electrode by a known method such as a sol-gel method, a sputtering method or an MOCVD method, and then annealed. Examples of specific ferroelectric materials include PZT, PLZT, $SrBi_2Ta_{2-x}Nb_xO_9$. The condition for the annealing may be properly controlled depending on the material to be used and the method for forming the ferroelectric film, but the annealing is preferably performed at a temperature of about 600° C. to about 800° C. for about 0.5 to about 30 minutes. In turn, a Pt film, a titanium nitride film and an aluminum film are sequentially deposited, for example, to thicknesses of about 500 Å/500 Å/1000 Å to about 1000 Å/1000 Å/2000 Å on the ferroelectric film by a known method such as a sputtering method or a PVD method.

Subsequently, (ii) the aluminum film and the titanium nitride film are successively etched. Specifically, the aluminum film and the titanium film are patterned into a desired configuration with the use of an etching gas containing a chlorine-based gas by employing the same bias power and pressure as described above. Preferably used as the chlorine-based gas is chlorine gas, which is supplied at a flow rate of about 30 sccm to about 80 sccm.

In turn, the Pt film may be etched with an etching gas adapted to suppress the deposition of substances including platinum. The etching of the Pt film may be conducted by using the same bias power and pressure as described above, and a gas mixture containing a chlorine-based gas and a fluorine-based gas as the etching gas. Examples of the chlorine-based gas and the fluorine-based gas include those previously described. Among those, the combination of $Cl_2/C_2F_6$, $Cl_2/Ar$, $Cl_2/C_2F_6/Ar$ is particularly preferred. The chlorine-based gas and the fluorine-based gas are supplied at flow rates of about 80 sccm/20 sccm to about 50 sccm/50 sccm, i.e., in a ratio of about 4/1 to about 1/1 by volume.

Then, (iii) the ferroelectric film is patterned by using the resulting upper electrode as a mask. The pattering may be achieved by dry etching. An etching gas to be used is preferably less reactive with aluminum. The etching may employ the same bias power and pressure as described above, and a gas mixture containing a chlorine-based gas or a fluorine-based gas and oxygen gas as the etching gas. Examples of the chlorine-based gas and the fluorine-based gas include those previously described. Among those, a combination of $SF_6/O_2$ or $CF_4/O_2$ is particularly preferred. The chlorine-based gas or the fluorine-based gas and oxygen gas are preferably supplied at flow rates of about 100 sccm/10 sccm to about 30 sccm/10 sccm, i.e., in a ratio of about 10/1 to about 3/1 by volume.

The nonvolatile semiconductor memory device to be fabricated in accordance with the fabrication process of the present invention is not limited to the COB (capacitor-on-bit-line) type memory device, but may be of such a construction that the bit line, the capacitor and the like are each provided as a different laminar structure. The transistor to be formed is not limited to the MOS transistor, but may be a MIS transistor or the like.

Referring to FIGS. 1(a) to 1(f), an explanation will be given to a process for fabricating a nonvolatile semiconductor memory device in accordance with one embodiment of the present invention. In FIGS. 1(a) to 1 (f), there are shown a silicon substrate 1, a LOCOS oxide film 2, a gate insulating film 3, a gate electrode 4, a source region 5a, a drain region 5b, a bit line 6, a BPSG film 7 serving as an inter-layer insulating film, a $TiO_2$ film 8 serving as a diffusion barrier film for a ferroelectric film, resists 9a, 9b and 9c, a double-layer film 10 comprised of a titanium nitride (TiN) film and a titanium (Ti) film, a tungsten (W) film 11, a TiN film 12, a platinum (Pt) film 13, a PZT film 14, a Pt film 15, a TiN film 16, and an aluminum (Al) film 17.

After formation of a MOS transistor, a contact hole is formed on a diffusion region (drain region 5b in a memory cell to be formed) , and a bit line 6 is formed of blanket tungsten (W). More specifically, an about 10,000 Å-thick BPGS film 7 is formed as an inter-layer insulating film over the entire surface of a semiconductor substrate, and the surface thereof is planarized by a CMP method. Then, an about 1,000 Å-thick $TiO_2$ film 8 is formed by a reactive sputtering method. A contact hole having a diameter of about 5,000 Å is formed in the BPSG film 7 and the $TiO_2$ film 8 on a drain region 5b of the transistor in the memory cell with the use of a mask of a resist 9a patterned into a predetermined configuration (FIG. 1(a)).

A double-layer film 10 composed of an about 500 Å-thick Ti film and an about 1,000 Å-thick TiN film and an about 5,000 Å-thick blanket W film are formed by a sputtering method to fill the contact hole. Then, the W film 11 and the TiN/Ti double-layer film 10 are etched back by a CMP method for formation of a contact plug (FIG. 1(b)).

At this time, the etching-back selectivity of the W film 11 and the TiN/Ti double-layer film 10 to the $TiO_2$ film 8 is greater than 10, so that the $TiO_2$ film 8 having a thickness of about 1,000 Å can be provided on the BPGS film 7 with a surface thereof being leveled with a top face of the contact plug. The contact plug comprised of the W film 11 and the TiN/Ti double-layer film 10 has a specific resistance of 10 $\mu$ Ω cm, which is lower than a contact plug comprised of a TiN/Ti double-layer film alone and typically having a specific resistance of 1 k $\mu$ Ω cm. Thus, the resistance of the contact plug can be reduced.

Figure 1C:
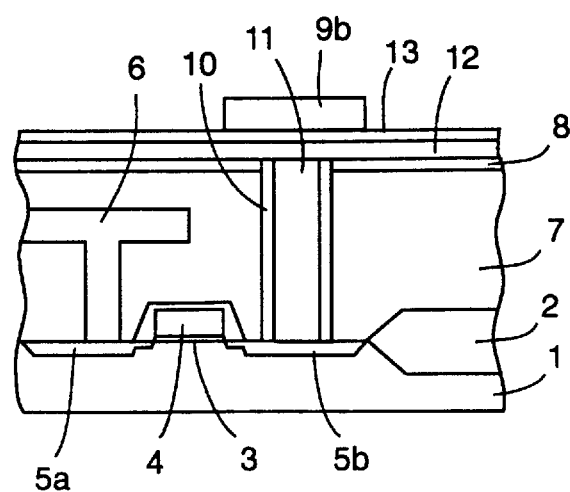
Figure 1D:
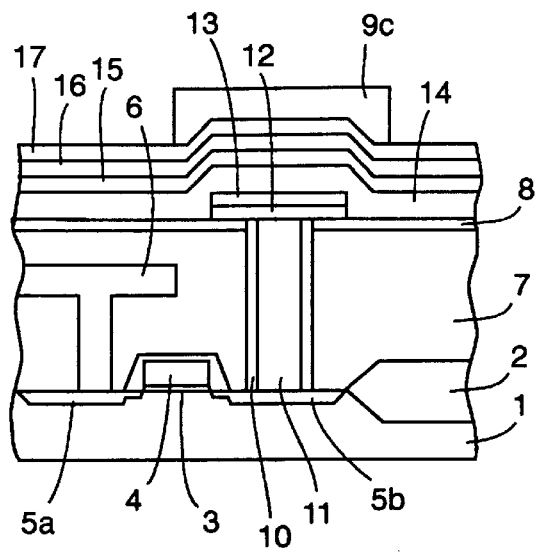
Figure 1E:
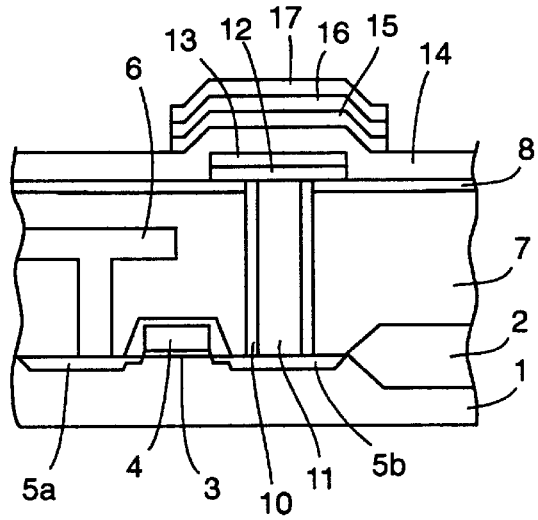
Figure 1F:
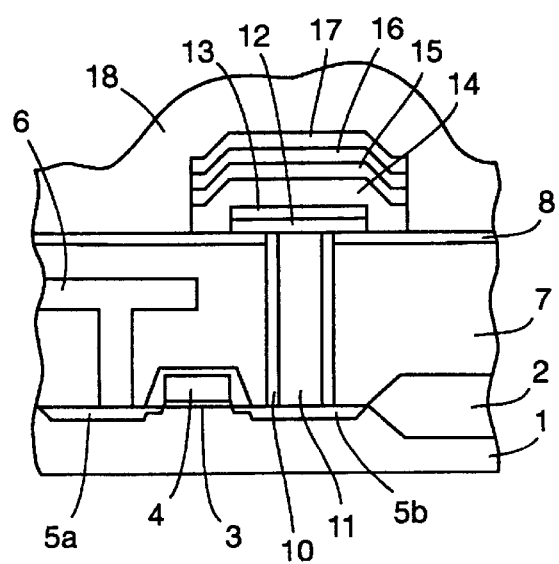
Figure 2:
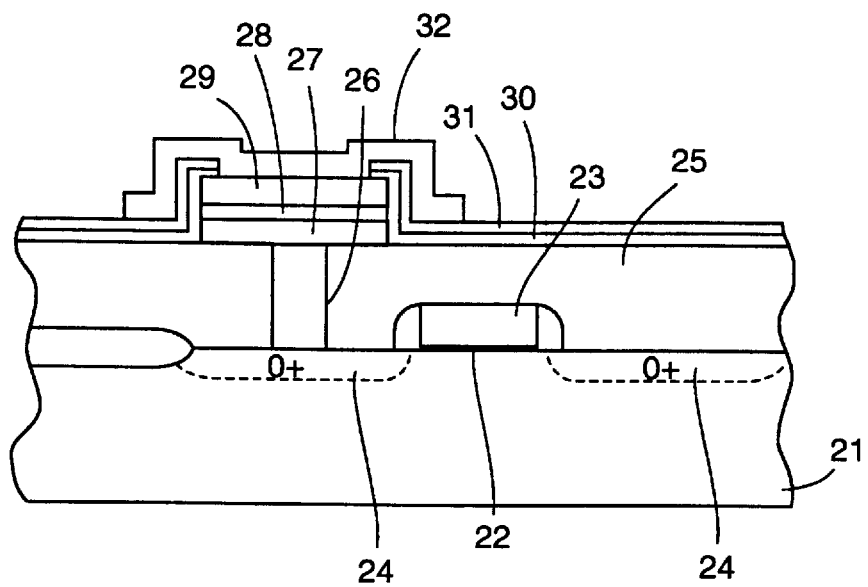
FIG. 2 is a sectional view illustrating the construction of a conventional nonvolatile semiconductor memory device.
Figure 3A:
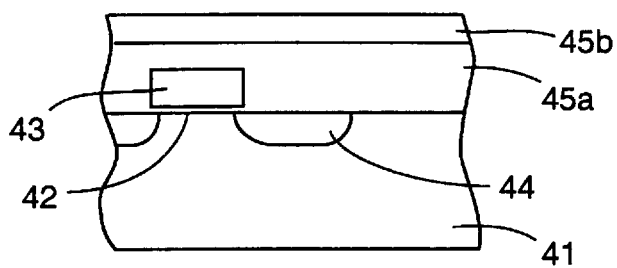
FIGS. 3(a) to 3(e) are sectional views for explaining a fabrication process of another conventional nonvolatile semiconductor memory device.
Figure 3B:
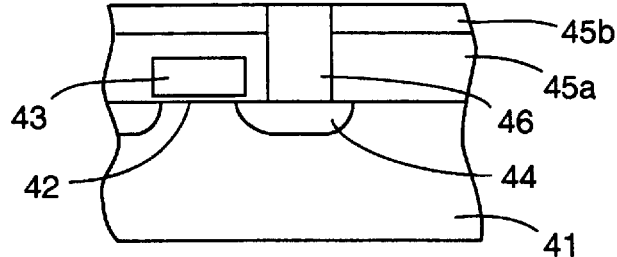
Figure 3C:
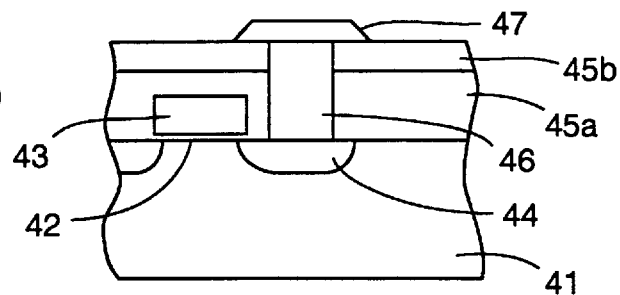
Figure 3D:
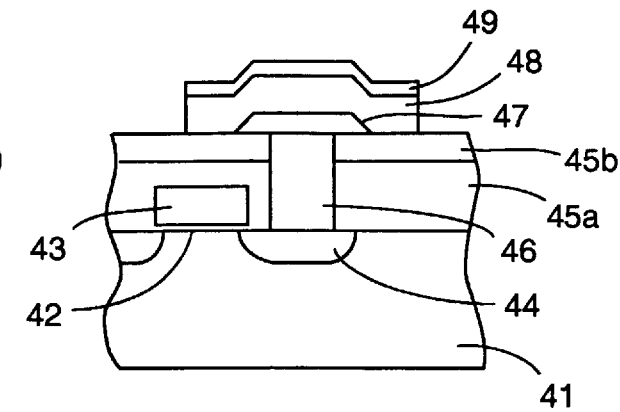
Figure 3E:
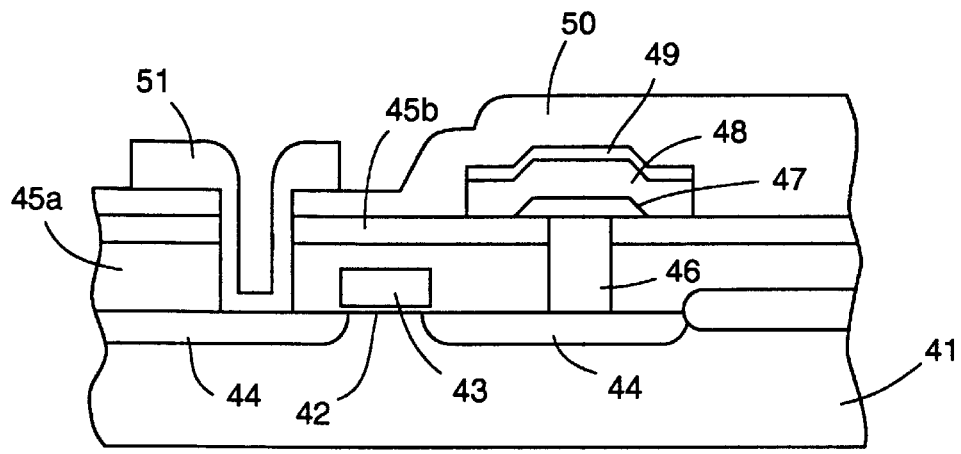
Figure 4:
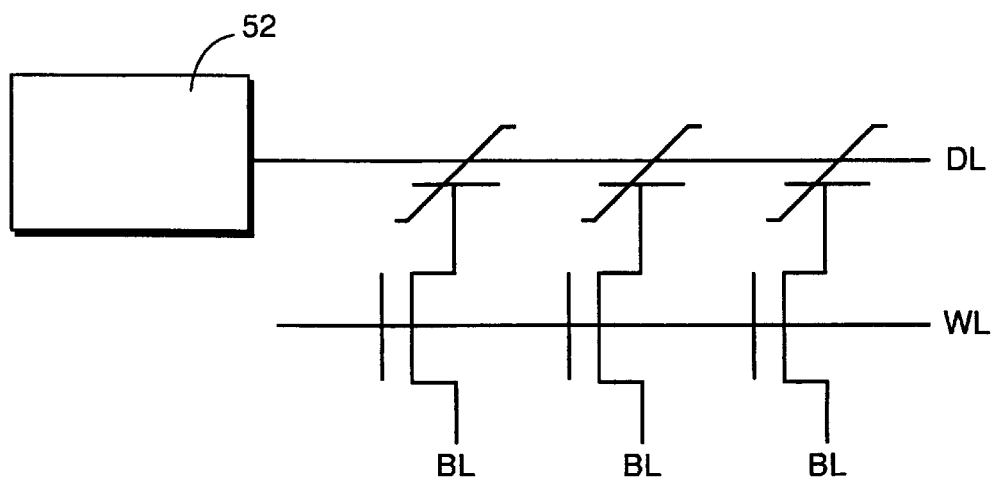
FIG. 4 is a circuit diagram of memory cells fabricated in accordance with the fabrication process shown in FIGS. 3(a) to 3(e).

In turn, an about 500 Å-thick TiN film 12 and an about 500 Å-thick Pt film 13 are sequentially formed by a sputtering method, and then processed by dry etching with the use of a mask of a resist 9b patterned into a predetermined configuration for formation of a lower electrode (FIG. 1(c)).

The dry etching of the Pt film 13 is performed with a bias power of 100 W at a pressure of 5 mTorr by means of a high density plasma system (bias ECR) . As an etching gas, $Cl_2$ gas and $C_2F_6$ gas are supplied to the system at flow rates of 80 sccm and 20 sccm, respectively. Although the etching of the Pt film typically employs $Cl_2$ gas, the fluorine-based gas is added to the etching gas so as to reduce the deposition of certain substances on side walls of the Pt film 13. The etching with the $C_2F_6/Cl_2$ etching gas by means of the high density plasma system causes the Pt film 13 to be tapered at an angle of smaller than 45°. The tapering of the lower electrode effectively improves the coverage characteristic.

The etching of the TiN film 12 is performed with a bias power of 50 W at a pressure of 5 mTorr. As an etching gas, $Cl_2$ gas and $O_2$ gas are supplied to the system at flow rates of 50 sccm and 10 sccm, respectively. As previously mentioned, the addition of $O_2$ gas to the etching gas improves the etching selectivity of the TiN film 12 to the $TiO_2$ film so that the $TiO_2$ film can stably be saved. This makes the $TiO_2$ film 8 less susceptible to the etching, increasing the etching selectivity of the TiN film 12 to the $TiO_2$ film 8 to greater than 10.

In turn, an about 2,000 Å-thick PZT film 14 is formed on the lower electrode comprised of the Pt film 13 and the TiN film 12 by a sol-gel method, a sputtering method or an MOCVD method, and then annealed. Thereafter, an about 1,000 Å-thick Pt film 15, an about 500 Å-thick TiN film 16 and an about 1,000 Å-thick Al film 17 are sequentially formed on the PZT film 14. These films are dry-etched with the use of a mask of a resist 9c patterned into a predetermined configuration by means of the high density plasma system (FIG. 1(d)).

The etching of the Al film 17 and the TiN film 16 is performed with a bias power of about 200 W at a pressure of about 5 mTorr. As an etching gas, $Cl_2$ gas is supplied to the system at a flow rate of 50 sccm. The etching of the Pt film 15 is performed with a bias power of about 200 W at a pressure of about 5 mTorr. As an etching gas, $Cl_2$ gas and $C_2F_6$ gas are supplied to the system at flow rates of 80 sccm and 20 sccm, respectively. The etching of the PZT film 14 is performed with a bias power of about 200 W at a pressure of 5 mTorr. As an etching gas, $SF_6$ gas and $O_2$ gas are supplied to the system at flow rates of 100 sccm and 10 sccm, respectively.

As described above, the Al film 17 and the TiN film 16 masked with the patterned resist 9c are first etched with the chlorine-based etching gas, and then the Pt film 15 is etched with the $Cl_2/C_2F_6$ etching gas. Since the resist 9c is almost lost at this stage, the resist 9c is removed and the Al film 17 is used as a mask for the etching of the PZT film 14.

Fluorine (F) contained in the $SF_6/O_2$ etching gas employed for the etching of the PZT film 14 is less reactive with the Al film 17. Further, the addition of $O_2$ gas reduces the etching rate of the Al film 17 and, hence, the thickness of the Al film 17 is hardly reduced during the etching of the PZT film 14.

Moreover, the addition of $O_2$ gas to the etching gas reduces the etching selectivity of the PZT film 14 to the $TiO_2$ film 18 to about 1. Where PZT and $TiO_2$ are deposited to thicknesses of about 2,000 Å and about 1,000 Å, respectively, for example, an about 400 Å-thick $TiO_2$ film remains even if the PZT film 14 is over-etched by about 30%. Therefore, the etching never breaks through the $TiO_2$ film 8 to reach the underlying BPSG film 7.

After the capacitor is formed in the aforesaid manner, an insulating film 18 is formed over the resulting substrate, and a contact hole is formed in the insulating film 18 for connection of the capacitor to a drive line driving circuit not shown. Then, an Al interconnection is formed by a prior-art technique (FIG. 1(f)).

As previously described, the nonvolatile semiconductor memory device fabricated in accordance with the fabrication process of the present invention has a reduced size, since the capacitor is formed such that the upper electrode and the ferroelectric capacitor insulating film are simultaneously patterned and the capacitor upper electrode also serves as the driving line. More specifically, where the 0.5 $\mu$m design rule is employed (capacitor size: 1.0 $\mu$ m²), the present invention provides for a cell size of 3.5 $\mu$ m², while the prior art provides for a cell size of about 10 $\mu$ m². Thus, the present invention contributes to the size reduction of the memory device.

While the present invention has been described in detail by way of the embodiment thereof, it should be understood that the embodiment is not limitative of the invention. The spirit and the scope of the present invention are to be limited only by the apended claims.

What is claimed is:

1. A process for fabricating a nonvolatile semiconductor memory device having one transistor and one ferroelectric capacitor electrically connected to each other by a contact plug, which comprising forming a transistor; forming an inter-layer insulating film, at least an upper surface portion thereof being a titanium oxide film; forming a capacitor lower electrode; and forming a capacitor insulating film and a capacitor upper electrode, wherein the lower electrode forming step comprises:
depositing a titanium nitride film and a platinum film on the titanium oxide film;
etching the platinum film with a first etching gas adapted to suppress deposition of substances including platinum; and
etching the titanium nitride film with a second etching gas having a high etching selectivity to the titanium oxide film.

2. A process as set forth in claim 1, wherein the first etching gas contains a chlorine-based gas and a fluorine-based gas.

3. A process as set forth in claim 2, wherein the first etching gas contains chlorine gas, and $C_nF_{2n+2}$ (n: a natural number), $CHF_3$ or $SiF_4$ gas in a volume ratio of about 4/1 to about 1/1.

4. A process as set forth in claim 1, wherein the second etching gas contains a chlorine-based gas or a fluorine-based gas and oxygen gas.

5. A process as set forth in claim 4, wherein the second etching gas contains chlorine gas or $SF_6$ gas, and oxygen gas in a volume ratio of about 50/1 to about 5/1.

6. A process as set forth in claim 1, wherein the capacitor insulating film/upper electrode forming step comprises:
(i) depositing a ferroelectric film, a platinum film, a titanium nitride film and an aluminum film over the entire surface of the inter-layer insulating film including the capacitor lower electrode;
(ii) etching the aluminum film and the titanium nitride film with a third etching gas, and etching the platinum film with a fourth etching gas adapted to suppress deposition of substances including platinum for formation of the capacitor upper electrode; and
(iii) etching the ferroelectric film with a fifth etching gas less reactive to aluminum by employing the resulting upper electrode as a mask for formation of the capacitor insulating film.

7. A process as set forth in claim 6, wherein the third etching gas in step (ii) is chlorine gas.

8. A process as set forth in claim 6, wherein the forth etching gas in step (ii) contains a chlorine-based gas and a fluorine-based gas.

9. A process as set forth in claim 8, wherein the forth etching gas contains chlorine gas, and $C_nF_{2n+2}$ (n: a natural number), $CHF_3$ or $SiF_4$ gas in a volume ratio of about 4/1 to about 1/1.

10. A process as set forth in claim 6, wherein the fifth etching gas in step (iii) contains $CF_4$ or $SF_6$ gas, and oxygen gas.

11. A process as set forth in claim 10, wherein $CF_4$ or $SF_6$ gas, and oxygen gas are contained in the fifth etching gas in a volume ratio of about 10/1 to about 3/1.

12. A process as set forth in claim 1, wherein a contact plug is formed by opening a contact hole in the inter-layer insulating film, depositing a titanium film and a titanium nitride film sequentially over the inter-layer insulating film including the contact hole, depositing a tungsten film on the titanium nitride film so as to fill the contact hole, and etching back the titanium film, the titanium nitride film and the tungsten film by a CMP method to such an extent that the inter-layer insulating film is exposed.

* * * * *